United States Patent [19]

Angelini et al.

[11] Patent Number: 4,764,957
[45] Date of Patent: Aug. 16, 1988

[54] EARPIECE, TELEPHONE HANDSET AND HEADPHONE INTENDED TO CORRECT INDIVIDUAL HEARING DEFICIENCIES

[75] Inventors: Theophile M. Angelini; Georges Canévet; Marc S. Foti; François C. Santon, all of Marseille, France

[73] Assignee: Centre National de la Recherche Scientifique-C.N.R.S., Paris, France

[21] Appl. No.: 767,418

[22] Filed: Aug. 20, 1985

[30] Foreign Application Priority Data

Sep. 7, 1984 [FR] France .................. 84 13891

[51] Int. Cl.$^4$ .................. H04R 1/03; H04R 1/22; H04R 25/00; H03G 5/02
[52] U.S. Cl. .................. 379/433; 379/52; 379/422; 381/68.2; 381/98
[58] Field of Search ............ 179/103, 107 R, 107 FD, 179/156 R, 178, 182 R; 381/68, 74, 98, 68.2, 68.4, 183, 187; 379/433, 422, 387, 442, 52

[56] References Cited

U.S. PATENT DOCUMENTS

| | | | |
|---|---|---|---|
| 2,167,462 | 7/1939 | Rechnitzer | 381/98 |
| 2,186,072 | 1/1940 | Huth | 381/74 |
| 2,411,190 | 11/1946 | Brown | 381/68 |
| 2,659,772 | 11/1953 | O'Hara | 379/52 |
| 2,778,889 | 1/1957 | Hausdorf | 381/187 |
| 3,101,390 | 8/1963 | Maille | 381/98 |
| 3,784,750 | 1/1974 | Stearns et al. | 381/98 |
| 3,818,149 | 6/1974 | Stearns et al. | 381/98 |
| 3,849,602 | 11/1974 | Gendin | 381/187 |
| 4,119,814 | 10/1978 | Harless | 381/68.2 |
| 4,293,937 | 10/1981 | Sharp et al. | 330/132 |
| 4,298,970 | 11/1981 | Shawhan et al. | 333/173 |
| 4,320,473 | 3/1982 | Smither et al. | 375/119 |
| 4,321,680 | 3/1982 | Bertrand et al. | 364/485 |
| 4,489,610 | 12/1985 | Slavin | 73/585 |
| 4,596,899 | 6/1986 | Wojcik et al. | 379/52 |

FOREIGN PATENT DOCUMENTS

| | | |
|---|---|---|
| 690001 | 2/1967 | Belgium . |
| 1512717 | 5/1969 | Fed. Rep. of Germany . |
| 2511211 | 11/1983 | France . |
| 536577 | 6/1973 | Switzerland . |
| 2116388 | 9/1983 | United Kingdom . |

OTHER PUBLICATIONS

1981 IEEE International Symposium on Circuits and Systems Proceedings, vol. 1 of 3, Apr. 27–29, 1981, pp. 303–306, Chicago, US; W. Brandenbusch: "Multiple Parameter Tunable Active Integrator Filters".

Primary Examiner—Jin F. Ng
Assistant Examiner—Danita R. Byrd
Attorney, Agent, or Firm—Balogh, Osann, Kramer, Dvorak, Genova & Traub

[57] ABSTRACT

An earpiece comprises a suction cup sensor, a preamplifier, a potentiometer for varying the gain of the amplifier, a pass band filter and electronic means enabling the user to adjust the central frequency and/or width of the pass band of the filter. One application of the invention is the construction of self-contained and individualized telephone handsets or headphones which may be connected without any wire connection on any telephone set.

9 Claims, 3 Drawing Sheets

EARPIECE, TELEPHONE HANDSET AND HEADPHONE INTENDED TO CORRECT INDIVIDUAL HEARING DEFICIENCIES

FIELD OF THE INVENTION

The present invention relates to earpieces, particularly earpieces of telephone handsets or headphones, intended for correcting individual hearing deficiencies.

The technical sector covered by the invention is that of the construction of telephonic or radiophonic listening equipment.

An appreciable percentage of the population suffers from hearing deficiencies which are generally expressed by a poor perception of the sounds located within a frequency band of which the position and width vary depending on the individuals.

People hard of hearing often have difficulties in telephoning or using radio or telephone headphones, as the voice is deformed and they have difficulty in understanding the person who is speaking.

One of the objects of the present invention is to provide earpieces incorporated in telephone handsets or headphones, which are self-contained and individualized, with the result that a person hard of hearing may have his own telephone handset or headphone which he has adjusted to correct his own hearing deficiencies and he may move with his handset or headphone, using them with any telephonic or radiophonic apparatus.

Another object of the present invention is to provide self-contained telephone headsets having an electrical supply incorporated therein, and individualized since they comprise adjustable electronic circuits which make it possible to correct the user's own hearing deficiencies and these individualized handsets or headphones can be connected to a telephone or a radio receiver by a link by electromagnetic sensor with induction or by a radio link, with the result that they may be used with any telephonic apparatus without any wire connection thereon and without having to obtain permission from the telephone company.

It is a further object of the present invention to provide earpieces incorporated in telephone handsets or headphones which may be mass-produced and adjusted individually to the hearing deficiencies peculiar to their usual user or even to the deficiences of several successive users.

BACKGROUND OF THE INVENTION

Telephone handsets for the hard-of-hearing are known, which comprise a variable gain amplifier which amplifies the sound uniformly in all the frequencies.

Special telephone earpieces for the hard-of-hearing are also known, provided with a hearing aid. These earpieces are coupled with a magnetic coil which transmits electromagnetic signals by induction to the hearing aid placed on the telephone position (T.).

The first of these known devices makes it possible to improve perception of the sounds by increasing the general sound level but it does not make any correction adapted to the individual deficiency of the user.

The second of these known devices makes it possible to telephone, using a hearing aid, but it makes no correction other than that due to the hearing aid.

The devices according to the invention have a different objective. In general, the ear of a person hard-of-hearing perceives with difficulty the sounds located in a determined frequency range.

A device according to the invention makes a spectral modification of the sounds intended to compensate the sensitivity curve of the ear by reinforcing the perception of the frequencies poorly perceived by the ear, with the result that, finally, the ear perceives all the frequencies with approximately the same sensitivity and the auditive acuteness of the user of an earpiece according to the invention is substantially uniform within the whole range of acoustic frequencies.

SUMMARY OF THE INVENTION

The objects of the invention are attained by means of earpieces, particularly earpieces of telephone handsets or headphones, which comprise an electronic low-pass filter and electronic means enabling the user to adjust the central frequency and/or the width of the pass band of the filter which are incorporated in the mobile support of the earpiece.

An earpiece according to the invention advantageously comprises a variable gain preamplifier incorporated therein and means enabling the user to adjust the gain.

According to a preferred embodiment, the means for varying the central frequency and/or the width of the pass band of the filter comprise electronic switches which are incorporated in the filter and whose resistance varies as a function of the cyclic ratio of a train of rectangular pulses applied on their gate and they further comprise means for sending trains of rectangular pulses onto the gate of the electronic switches and for varying the cyclic ratio of the pulse trains.

The invention results in novel earpieces which comprise incorporated circuits enabling a person hard-of-hearing to correct himself, by electronic means, the spectrum of emission of the earpiece, so that the latter presents a reinforcement of the electric and acoustic signals in a pass band which substantially covers the pass band in which the hearing deficiency of the user is located.

The earpieces according to the invention present the advantage of being able to be mass-produced on the same model and thereafter of being adjusted individually by each user depending on his personal needs.

The earpieces according to the invention enable self-contained and individualized telephone handsets or earphones to be manufactured which may be transported by the user and connected without any wire connection on any telephone, with the result that a person hard-of-hearing, whose deficiencies are such that he has difficulty in understanding people on the telephone, may thus correct his deficiencies and call from any telephone.

The earpieces according to the invention, which comprise correction means incorporated in each earpiece and adaptable to the deficiency of the ear on which the earpiece is placed, make it possible, in particular, to produce head phones with two self-contained, individualized earpieces on which the user may adjust the correction of each earpiece independently as a function of the deficiency of each ear. Such individualized earphones may advantageously be used by operators whose profession involves wearing earphones, for example telephonists, traffic controllers, radio reporters, etc.

The means according to the invention, which are incorporated directly in the earpiece, as opposed to correction means incorporated in a telephone appliance, make it possible to produce telephone sets or headphones which are individualized and transportable from one set to another.

BRIEF DESCRIPTION OF THE DRAWINGS

The invention will be more readily understood on reading the following description with reference to the accompanying drawings, in which.

DETAILED DESCRIPTION OF THE INVENITON

Figure 1:
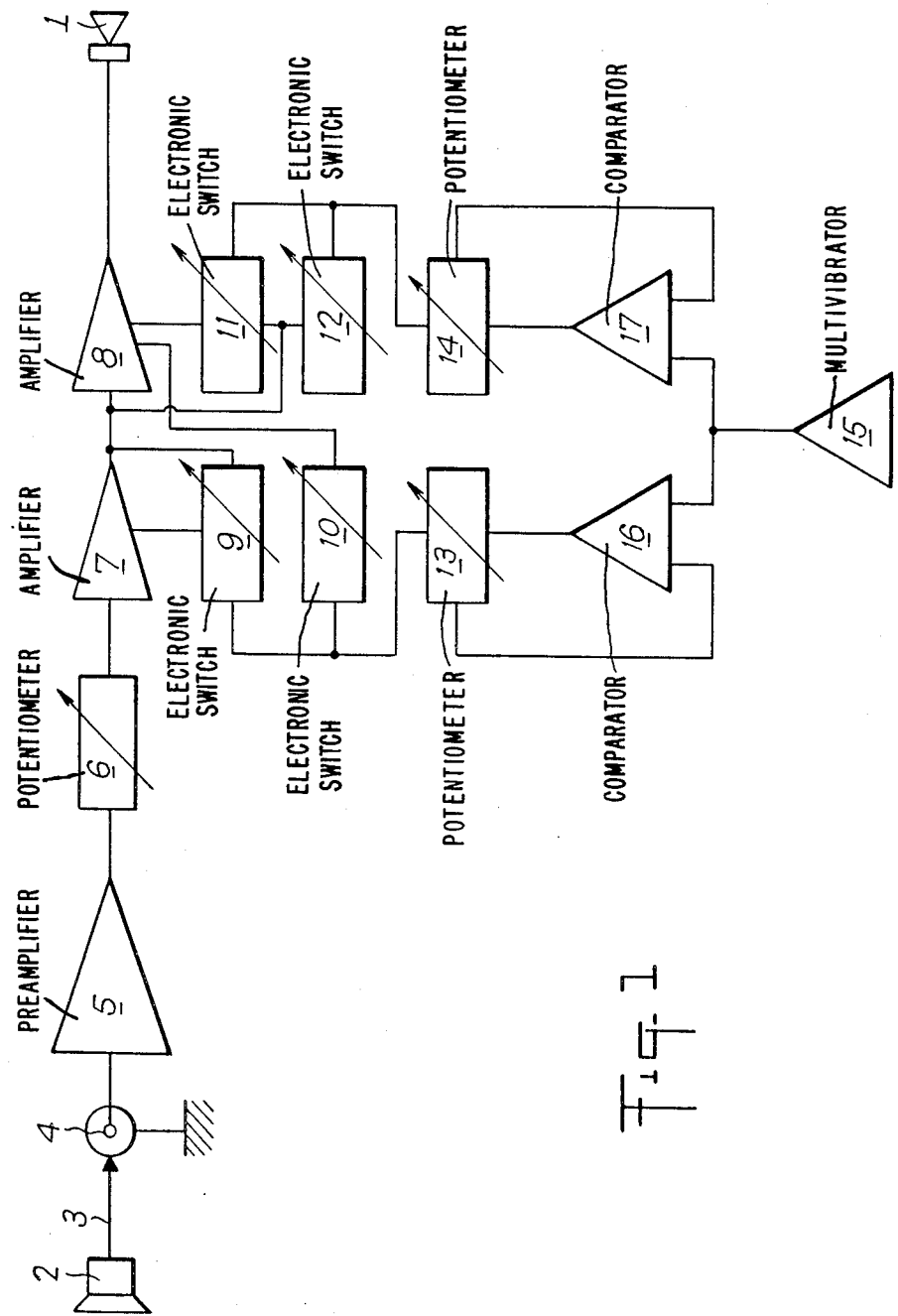
FIG. 1 is a block diagram of the essential components of a device according to the invention.

Referring now to the drawings, FIG. 1 shows an earpiece 1 which is an electro-acoustic transducer of any known type and which is for example the earpiece of a telephonic or radiophonic headphone.

FIG. 1 shows a telephone earpiece 1 which is connected to a telephone set by an electromagnetic induction sensor 2 which is provided with a suction cup applied against the telephone appliance and which is connected by a flexible cord 3 to an input socket 4. This link by sensor and cable may be replaced by a radio link, which exists on certain portable telephone handsets.

The electronic circuits are incorporated in the support of the earpiece, for example in a telephone set or in a head phone. They comprise a variable gain preamplifier 5. Reference 6 represents a potentiometer which makes it possible to adjust the gain of the preamplifier.

The electric signals leaving the preamplifier pass in a pass band filter which comprises two operational amplifiers 7 and 8 associated with electronic switches 9, 10, 11 and 12. These electronic switches are for example switches forming part of an integrated circuit CD 4016 marketed by NATIONAL SEMI CONDUCTORS, which comprises four switches on the same wafer. Each switch has three terminals: an input terminal, an output terminal and a gate terminal.

The resistance between the input and output terminal varies continuously between 0 and 10 KΩ, depending on the cyclic ratio of a train of rectangular pulses at constant frequency applied on the gate.

The electronic switches 9 and 10 make it possible to vary the central frequency of the pass band of the filter by acting on a potentiometer 13.

The electronic switches 11 and 12 make it possible to vary the width of the pass band of the filter by acting on a potentiometer 14.

The electronic switches 9 and 10, on the one hand, and 11 and 12, on the other hand, are controlled in parallel by trains of rectangular pulses with variable cyclic ratio.

Reference 15 represents an astable multivibrator which emits a voltage at constant triangular frequency, i.e. a voltage which increases progressively with a constant gradient and which decreases suddenly. This voltage is sent in parallel onto the input terminals of like polarity of two operational amplifiers 16 and 17 mounted as a comparator, which each compare this voltage with a reference voltage, of which the level is adjusted by potentiometers 13 and 14.

As long as the increasing voltage is lower than the reference voltage applied thereto, the comparator 16 or 17 emits a signal of a determined level, for example of zero level.

As soon as the increasing voltage becomes higher than the reference voltage which is applied thereto, the comparator 16 or 17 emits a signal of level opposite the preceding one. It is therefore seen that the comparators 16 and 17 each emit a train of rectangular pulses, of which the frequency is constant and equal to the frequency of the multivibrator 15 and of which the cyclic ratio, i.e. the ratio between the duration of the pulses and the duration of the intervals separating two pulses varies as a function of the reference voltages applied by potentiometers 13 and 14 to the inputs of comparators 16 and 17.

Figure 2:
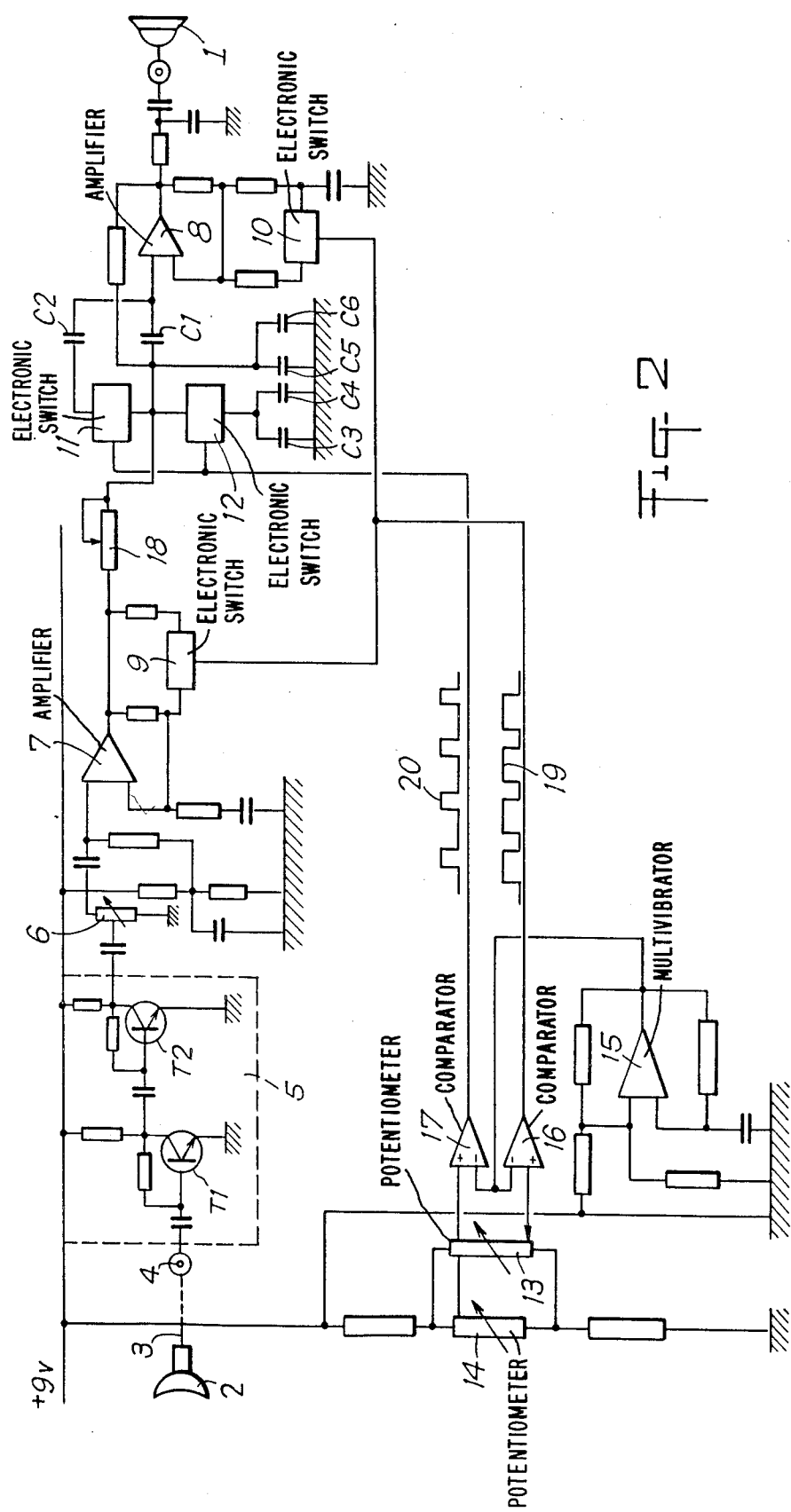
FIG. 2 is a diagram of a preferred embodiment of a device according to FIG. 1.

FIG. 2 shows a preferred embodiment of a device according to FIG. 1. FIG. 2 shows a sensor 2 which is for example an induction sensor, which is connected by a flexible cord 3 to an input terminal 4 of the device.

FIG. 2 shows, in a rectangle 5 in broken lines, an embodiment of a preamplifier composed of two transistors T1 and T2.

Reference 6 represents a potentiometer which enables the gain of the preamplifier 5 to be varied.

Reference 7 represents an operational amplifier which comprises a negative feedback loop, in which is mounted an electronic switch 9, which enables the resistance of the negative feedback loop to be varied continuously.

The amplifier 7 and the negative feedback loop constitute a selective amplifier and, by varying the negative feedback, the pass band is varied.

Reference 18 represents a potentiometer which is adjusted at construction and which makes it possible to adjust the limits between which it is possible to vary the central frequency of the pas band.

The output of the potentiometer 18 is connected to an assembly of filtering capacitors C1, C2, C3 and C4, mounted in parallel, C5 and C6, likewise mounted in parallel.

Capacitor C2 is mounted in series with an electronic variable resistance switch 11. Similarly, capacitors C3 and C4 are mounted in series with an electronic variable resistance switch 12.

The capacitors and resistances constitute a pass band filter and, by continuously varying the resistances of switches 11 and 12, the width of the pass band of this filter is varied.

Reference 8 represents a second selective amplifier which comprises, in its negative feedback loop, an electronic variable resistance switch 10.

The selective amplifiers 7 and 8 constitute a pass band filter and, by varying the resistances of switches 9 and 10, the central frequency of the pass band of this filter is varied.

Reference 15 represents an astable multivibrator which emits a triangular voltage at constant frequency. This multivibrator is constituted for example by an integrated circuit marketed by FAIRCHILD under reference MA 741.

The output of the multivibrator 15 is connected in parallel on the terminals of negative polarity of two operational amplifiers 16 and 17.

The terminals of positive polarity of these two amplifiers are connected respectively on two potentiometers 13 and 14 which make it possible independently to vary the reference voltages applied to these positive terminals. Each amplifier 16 and 17 compares the progressively increasing voltage delivered by the multivibrator 15 with a reference voltage and emits a pulse in the form of a rectangular gate for the whole period of time when the variable voltage is higher than the reference voltage. The width of these pulses and therefore the cyclic ratio of the pulse trains emitted by comparators 16 and 17 are therefore a function of the reference voltage and therefore of the position of the potentiometers 13 and 14.

FIG. 2 shows two pulse trains 19 and 20 having the same frequency and different cyclic ratios.

The pulse train 19 emitted by the comparator 16 is sent in parallel on the gates of the electronic switches 9 and 10, of which the resistance varies as a function of the cyclic ratio of the pulse train 19. The potentiometer 13 therefore makes it possible to vary the central frequency of the pass band of the filter constituted by the selective amplifiers 7 and 8.

Similarly, the pulse train 20 emitted by the comparator 17 is sent in parallel on the gates of the two electronic switches 11 and 12 of which the resistance varies as a function of the cyclic ratio of the pulse train 20.

Potentiometer 14 therefore makes it possible to vary the width of the pass band of the filter.

Figure 3:
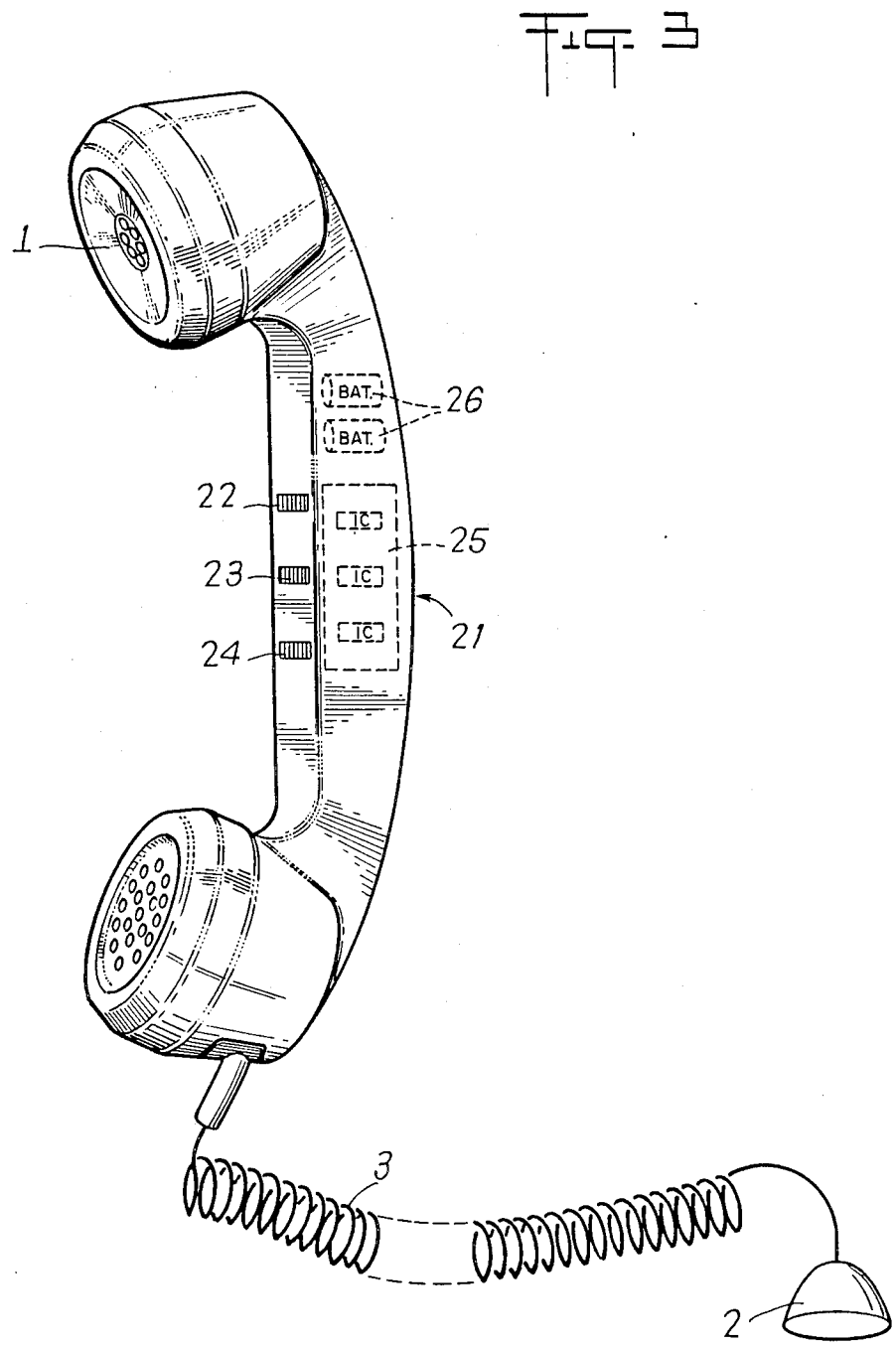
FIG. 3 is a perspective view of a telephone handset according to the invention.

FIG. 3 is a view in perspective of a telephone handset 21 according to the invention.

This handset 21 comprises in the part connecting the microphone to the earpiece, an assembly 25 of circuits according to FIG. 2 which may be made as integrated circuits (IC) taking up little space. It comprises a D.C. source (BAT.) 26 for example cells or a small rechargeable battery which supplies these circuits.

It comprises three knurls or control knobs 22, 23 and 24. Knurl 22 acts on the potentiometer 6. It makes it possible to adjust the preamplification gain 5 and therefore the overall sound level.

Knurls 23 and 24 control potentiometers 13 and 14 and make it possible to adjust the central frequency of the pass band and the width of this band, respectively. For example, the central frequency is adjustable between 800 Hz and 4.5 KHz and the width of the pass band may be varied between 100 Hz and 3 KHz.

Thanks to the possibility of adjusting the position of the pass band and the width thereof separately, an apparatus according to the invention enables every one to adapt the correction individually to his own hearing deficiencies and to correct, satisfactorily, all the partial deficiencies which are usually encountered in the hard-of-hearing.

The handset 21 comprises a flexible cord 3 bearing, at its end, a suction cup sensor 2 which may be applied against a telephone appliance without any connection.

In a variant embodiment, the link between the handset 21 and a telephone appliance may be a radio link.

A handset 21 according to the invention is a self-contained handset thanks to its supply incorporated therein and its sensor 2. A person hard-of-hearing may possess such a handset, adjust it to correct his hearing deficiencies and transport it in his travels to make calls from any telephone.

FIG. 3 shows an embodiment in which all the handsets are mass-produced in the same design and each user may adapt his handset to his personal deficiencies.

In a variant, handsets according to the invention may be made which comprise filters in the form of plug-in modules and, in that case, a doctor may measure the audiogram of a patient, deduce therefrom the position and width of the frequency band where hearing is deficient and place a plug-in filter in the handset which corrects the particular deficiency of the patient.

FIG. 3 shows a self-contained, individualized telephone handset. It is specified that self-contained, individualized headphones may also be constructed, which comprise a filter incorporated in the headphones and means, likewise incorporated therein, enabling the user to adjust the central frequency and/or the pass band of the filter.

In the case of headphones which comprise two earpieces, as people hard-of-hearing frequently do not have the same deficiency in both ears, two filters are preferably incorporated in the headphones, one for each earpiece, so that the user may adjust the correction for each ear independently.

It is specified that FIG. 2 shows only one embodiment of the electronic circuits.

The pass band filter and the means for varying the central frequency and the width of the pass band of the filter which have been shown in this Figure may be replaced by any other equivalent electronic means performing the same functions of pass band filtering and of adjustment of the central frequency and the width of the pass band of the filter.

What is claimed is:

1. An earpiece of the type comprising electronic filter means to adapt the frequency response curve of said earpiece to a user's hearing deficiencies, said filter means comprising an adjustable pass-band filter, the pass-band of which has a central frequency and a width, and electronic switches, each electronic switch having a control electrode and a resistance which depends on a cyclic ratio of a train of rectangular pulses applied on said control electrode, said filter means further comprising means for producing trains of rectangular pulses at constant frequency which are connected to said control electrode and means for varying the cyclic ratio of each train of rectangular pulses in order to vary the resistance of said electronic switches so that said central frequency and said width are adjustable independently of each other by a user adapted the band-pass of the filter to his acoustic deficiencies.

2. An earpiece according to claim 1, wherein said means for varying the cyclic ratio of said trains of retangular pulses comprise a generator of triangular voltage at constant frequency, two comparators which compare the increasing voltage supplied by said generator with a reference voltage and two potentiometers actuable by the user which enable said reference voltage to be varied, thereby varying the cyclic ratio of two trains of rectangular pulses delivered by the two comparators and varying independently of each other, said central frequency and said width of the pass-band of said pass-band filter.

3. An earpiece according to claim 2, wherein said pass-band filter comprises two selective amplifiers each having a feedback loop comprising one of said electronic switches and the control electrodes of two of said electronic switches are connected in parallel to the output of the first one of said two comparators which delivers a first train of rectangular pulses having a cyclic ratio adjustable by the first one of said potentiometers so that said potentiometer enables the resistance of said two electronic switches and the central frequency of the pass-band of said filter to be varied.

4. An earpiece according to claim 3, wherein said pass-band filter further comprises a passive filter comprising capacitors and two additional electronic switches, the control electrodes of which are connected in parallel to the output of the second of said comparators which delivers a second train of rectangular pulses having a cyclic ratio adjustable by the second of said potentiometers so that said potentiometer enables the resistance of said two additional electronic switches and the width of the pass-band of said pass-band filter to be varied.

5. An earpiece according to claim 1, in which said electronic filter means and electronic switches are supplied with a direct current source and configured to be mounted in a telephone handset which comprises detachable means for connecting said handset to a telephone apparatus, and a pair of potentiometers provided with knurls, which potentiometers enable the cyclic ratio of a train rectangular pulses applied to said control electrodes of said switches to be varied.

6. A self-contained and individualized telephone handset comprising a direct current source and detachable means for connecting said handset with a telephone apparatus, wherein said handset comprises one adjustable pass-band filter and two potentiometers, the pass-band of said filter having a central frequency and a width adjustable independently of each other by means of said two potentiometers, said pass-band filter being connected on an earpiece of said telephone handset and each of said two potentiometers being equipped with a knurl so that a user of said handset may vary the width and the central frequency of the pass-band independently of each other to adapt this pass-band to his proper hearing deficiencies.

7. A self-contained and individualized telephone handset comprising a direct current source and detachable means for connecting said handset with a telephone apparatus wherein an earpiece of said handset comprises an adjustable pass-band filter, the pass-band thereon having a central frequency and a width adjustable independently of each other, said pass-band filter comprising integrated circuits forming electronic switches which have a control electrode and a resistance which depends on a cyclic ratio of a train of rectangular pulses at constant frequency applied on said gate, and further comprising two means for producing two trains of rectangular pulses each having a cyclic ratio adjustable by a potentiometer having a knurl, said producing means being connected to said control electrodes of said electronic switches, so that a user of said telephone handset can adapt said earpiece to his hearing deficiencies by turning said two knurls which enable the resistances of said switches to be varied and consequently the central frequency and the width of said pass-filter to be varied independently of each other.

8. A self-contained and individualized telephone handset comprising an earpiece, a microphone, a direct current source and detachable means for connecting said handset with a telephone apparatus, wherein said earpiece comprises one adjustable pass-band filter and two potentiometers, the pass-band of said filter having a central frequency and a width adjustable independently of each other by means of said two potentiometers, said pass-band filter being connected to said earpiece and each of said two potentiometers being equipped with a knurl so that a user of said handset may vary the width and the central frequency of the pass-band independently of each other to adapt this pass-band to his proper hearing deficiencies.

9. A self-contained and individualized telephone handset comprising an earpiece, a microphone, a direct current source and detachable means for connecting said handset with a telephone apparatus, wherein said earpiece comprises an adjustable pass-band filter the pass-band thereof having a central frequency and a width adjustable independently of each other, said pass-band filter comprising integrated circuits forming electronic switches which have a control electrode, and a resistance which depends on a cyclic ratio of a train of rectangular pulses at constant frequency applied on said control electrode, and further comprising means for producing two trains of rectangular pulses each having a variable cyclic ratio adjustable by a potentiometer having a knurl, said producing means being connected on said control electrode so that a user adapting the telephone handset to his hearing deficiencies turns said knurls to vary the cyclic ratio of said trains of rectangular pulses, so as to vary the effective resistances of said electronic switches, enabling said central frequency and said width to be varied independently of each other.

* * * * *